(12) United States Patent
Shin et al.

(10) Patent No.: US 10,529,565 B2
(45) Date of Patent: Jan. 7, 2020

(54) METHOD OF FORMING AMORPHOUS SILICON LAYER

(71) Applicant: WONIK IPS CO., LTD., Pyeongtaek-si, Gyeonggi-do (KR)

(72) Inventors: Chang Hak Shin, Pyeongtaek-si (KR); Young Chul Choi, Hwaseong-si (KR)

(73) Assignee: WONIK IPS CO., LTD., Pyeongtaek-si Gyeonggi-do (KR)

( * ) Notice: Subject to any disclaimer, the term of this patent is extended or adjusted under 35 U.S.C. 154(b) by 0 days.

(21) Appl. No.: 16/199,046

(22) Filed: Nov. 23, 2018

(65) Prior Publication Data
US 2019/0164755 A1    May 30, 2019

(30) Foreign Application Priority Data
Nov. 28, 2017    (KR) .................. 10-2017-0160691

(51) Int. Cl.
| | |
|---|---|
| H01L 21/033 | (2006.01) |
| H01L 21/02 | (2006.01) |
| C23C 16/50 | (2006.01) |
| C23C 16/24 | (2006.01) |

(52) U.S. Cl.
CPC ........ *H01L 21/02592* (2013.01); *C23C 16/24* (2013.01); *C23C 16/50* (2013.01); *H01L 21/0262* (2013.01); *H01L 21/02488* (2013.01); *H01L 21/02532* (2013.01)

(58) Field of Classification Search
CPC ......... H01L 21/02592; H01L 21/02488; H01L 21/02532; H01L 21/0262; H01L 21/0332; H01L 21/0335; H01L 21/0337; H01L 21/0338
See application file for complete search history.

(56) References Cited

U.S. PATENT DOCUMENTS

| | | | |
|---|---|---|---|
| 2017/0062218 A1* | 3/2017 | Duan | ................. H01L 21/0338 |
| 2018/0053652 A1* | 2/2018 | Choi | ................ H01L 21/02532 |

FOREIGN PATENT DOCUMENTS

KR    1020090116433 A    11/2009

* cited by examiner

*Primary Examiner* — Cuong Q Nguyen
(74) *Attorney, Agent, or Firm* — William Park & Associates Ltd.

(57) ABSTRACT

Provided is a method of forming an amorphous silicon layer, the method including supplying a reaction gas and an inert gas onto a substrate having an underlayer thereon, and stabilizing the gases while power for generating plasma is not being applied to a chamber, depositing an amorphous silicon layer on the underlayer by using plasma of the reaction gas, which is generated by applying a high-frequency (HF) power of 500 W to 700 W and, at the same time, applying a low-frequency (LF) power lower than the HF power to the chamber, providing a purge gas into the chamber, and pumping the chamber.

9 Claims, 8 Drawing Sheets

FIG. 5

| UNDERLAYER | SOH | TEOS | SiON | SiN | TiN | SiON |
|---|---|---|---|---|---|---|
| COMPARATIVE EXAMPLE 1 CONVENTIONAL a-Si | | | | | | |
| COMPARATIVE EXAMPLE 2 Pre-Treatment (UNDERLAYER SURFACE TREATMENT) | | | | | | |
| EMBODIMENT Dual Frequency (HF+LF) Dep. | | | | | | |

FIG. 6

| POWER | COMPARATIVE EXAMPLE<br>HF Power (Single Frequency) | EMBODIMENT<br>HF+LF Power (Dual Frequency) |
|---|---|---|
| CROSS | | |
| TILT | | |

FIG. 7

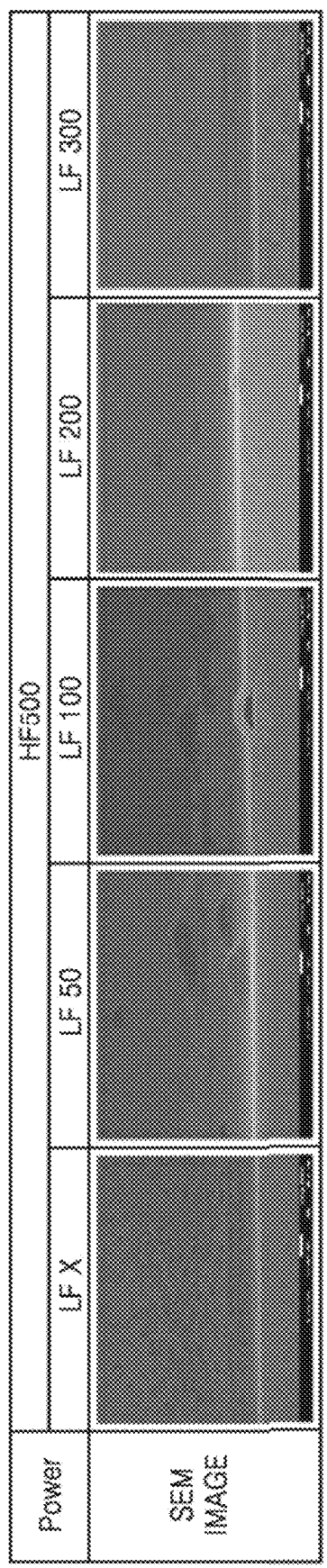

METHOD OF FORMING AMORPHOUS SILICON LAYER

CROSS-REFERENCE TO RELATED PATENT APPLICATION

This application claims the benefit of Korean Patent Application No. 10-2017-0160691, filed on Nov. 28, 2017, in the Korean Intellectual Property Office, the disclosure of which is incorporated herein in its entirety by reference.

BACKGROUND

1. Field

The present invention relates to a method of forming a material layer, and more particularly, to a method of forming an amorphous silicon layer.

2. Description of the Related Art

Since roughness or thickness uniformity of a deposited amorphous silicon layer is greatly variable, the amorphous silicon layer has a problem of a low process margin. Furthermore, since adhesion between an underlayer and the amorphous silicon layer is weak, peeling occurs. In addition, since the roughness of the amorphous silicon layer is bad, a subsequent process is not easily stabilized.

Related technology includes Korean Laid-open Patent Application No. 2009-0116433 (published on Nov. 11, 2009, and entitled "Forming method of amorphous silicone thin film".

SUMMARY

The present invention provides a method of forming an amorphous silicon layer, the method being capable of improving adhesion to an underlayer, layer quality, and roughness. However, the scope of the present invention is not limited thereto.

According to an aspect of the present invention, there is provided a method of forming an amorphous silicon layer, the method including supplying a reaction gas and an inert gas onto a substrate having an underlayer thereon, and stabilizing the gases while power for generating plasma is not being applied to a chamber, depositing an amorphous silicon layer on the underlayer by using plasma of the reaction gas, which is generated by applying a high-frequency (HF) power of 500 W to 700 W and, at the same time, applying a low-frequency (LF) power lower than the HF power to the chamber, providing a purge gas into the chamber, and pumping the chamber.

The LF power may be equal to or higher than 200 W and lower than 600 W.

The LF power may be equal to or higher than 200 W and equal to or lower than 300 W.

The reaction gas may include at least one selected from among monosilane, disilane, and trisilane gases, and the inert gas may include at least one gas selected from among helium (He), neon (Ne), and argon (Ar).

The amorphous silicon layer may have a thickness equal to or less than 500 Å, and the underlayer may include one selected from among a spin-on-hardmask (SOH) layer, a titanium nitride (TiN) layer, a silicon carbonitride (SiCN) layer, and a silicon oxynitride (SiON) layer.

The amorphous silicon layer may have a thickness equal to or greater than 800 Å, and the underlayer may include one selected from among a silicon oxide (SiO) layer and a silicon nitride (SiN) layer.

The HF power may have a frequency of 13.56 MHz to 27.12 MHz, and the LF power may have a frequency of 300 KHz to 600 KHz. For example, the HF power may have a frequency of 13.56 MHz, and the LF power may have a frequency of 370 KHz.

The depositing of the amorphous silicon layer may be performed at a process temperature of 150° C. to 550° C.

BRIEF DESCRIPTION OF THE DRAWINGS

The above and other features and advantages of the present invention will become more apparent by describing in detail embodiments thereof with reference to the attached drawings in which:

FIG. 5 is a table of images showing adhesion states of amorphous silicon layers to various underlayers, and damages of the underlayers, according to test examples of the present invention;

FIG. 6 is a table of images for checking issues relating to formation of layers of amorphous silicon layers having relatively large thicknesses and formed to be used as storage node hard masks, according to test examples of the present invention;

FIG. 7 is a table comparatively showing roughness of amorphous silicon layers formed according to test examples of the present invention; and FIGS. 8 and 9 are tables comparatively showing morphology of amorphous silicon layers formed on nitride layers, according to test examples of the present invention.

DETAILED DESCRIPTION

Figure 1:
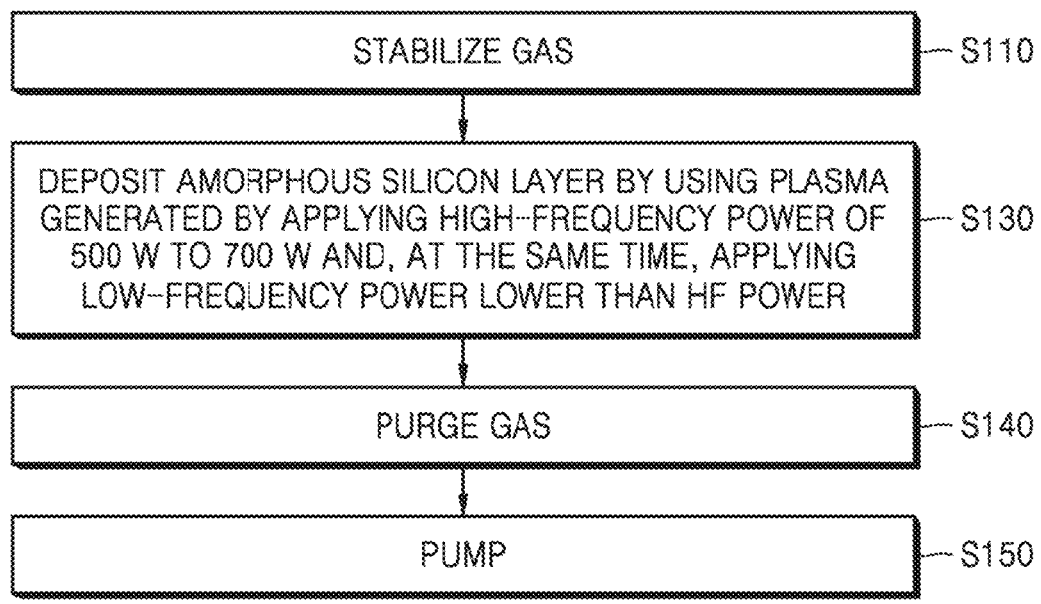
FIG. 1 is a flowchart of a method of forming an amorphous silicon layer, according to an embodiment of the present invention.

Throughout the specification, it will be understood that when an element, such as a layer, a region, or a substrate, is referred to as being "on" another element, it may be directly on the other element or intervening elements may be present. In contrast, when an element is referred to as being "directly on" another element, there are no intervening elements present.

Hereinafter, the present invention will be described in detail by explaining embodiments of the invention with reference to the attached drawings. In the drawings, variations from the shapes of the illustrations as a result, for example, of manufacturing techniques and/or tolerances, are to be expected. Thus, the embodiments of the invention should not be construed as limited to the particular shapes of regions illustrated herein, but are to include deviations in shapes that result, for example, from manufacturing. The thicknesses or sizes of layers in the drawings may be exaggerated for clarity of explanation. Like reference numerals denote like elements.

As used herein, a high-frequency (HF) power and a low-frequency (LF) power are powers applied to generate plasma in a chamber, and may be relatively distinguished on the basis of a frequency range of radio frequency (RF) power. For example, the HF power may have a frequency range of 3 MHz to 30 MHz, and more particularly, a frequency range of 13.56 MHz to 27.12 MHz. The LF power may have a frequency range of 30 KHz to 3,000 KHz, and more particularly, a frequency range of 300 KHz to 600 KHz.

Plasma may be generated based on a direct plasma process. The direct plasma process includes, for example, a process of directly generating plasma of a pre-treatment gas, a reaction gas, and/or a post-treatment gas in a treatment space of a chamber by supplying the pre-treatment gas, the reaction gas, and/or the post-treatment gas to the treatment space between electrodes and a substrate and applying frequency power.

For convenience, in this specification, a state in which a specific gas is activated using plasma is called 'plasma of the specific gas'. For example, a state in which a monosilane gas is activated using plasma is called monosilane plasma, a state in which an ammonia ($NH_3$) gas is activated using plasma is called ammonia ($NH_3$) plasma, and a state in which an ammonia ($NH_3$) gas and a nitrogen ($N_2$) gas are activated together using plasma is called ammonia ($NH_3$) and nitrogen ($N_2$) plasma.

Figure 2:
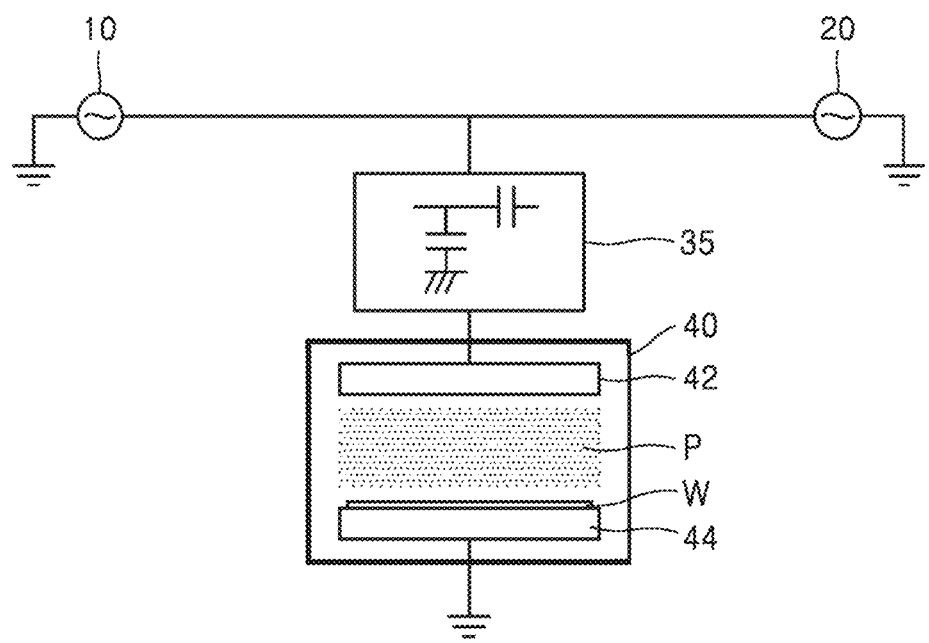
FIGS. 2 and 3 are conceptual diagrams of thin layer forming apparatuses for performing the method of forming an amorphous silicon layer based on a PECVD process, according to embodiments of the present invention.
Figure 3:
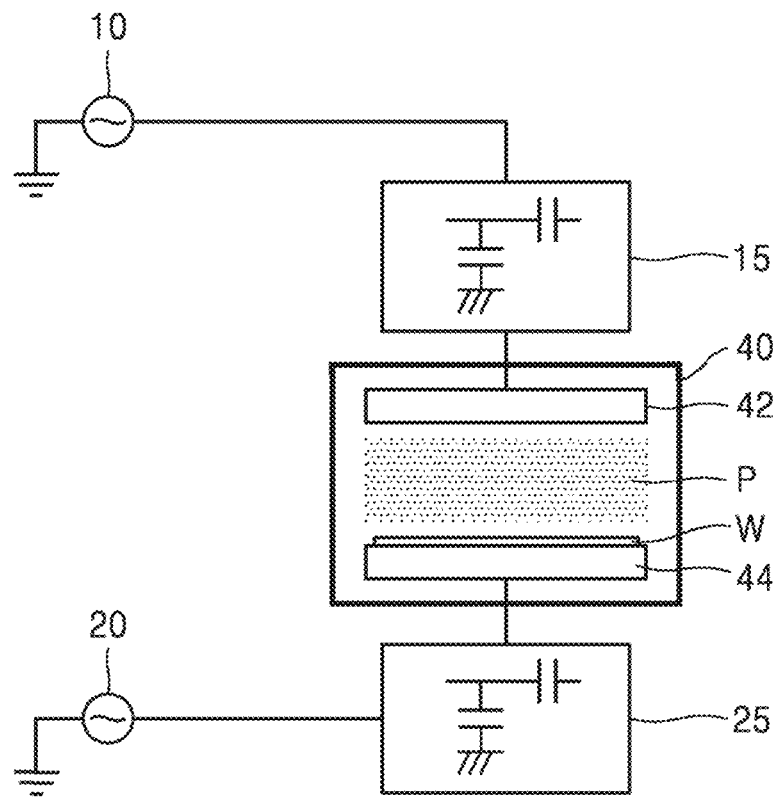

FIG. 1 is a flowchart of a method of forming an amorphous silicon layer based on a plasma enhanced chemical vapor deposition (PECVD) process, according to an embodiment of the present invention, and FIGS. 2 and 3 are conceptual diagrams of thin layer forming apparatuses for performing the method of forming an amorphous silicon layer based on a PECVD process, according to embodiments of the present invention.

The method of forming an amorphous silicon layer based on a PECVD process, according to an embodiment of the present invention, includes operation S110 for supplying a reaction gas and an inert gas into a chamber 40 and stabilizing the gases, operation S130 for depositing an amorphous silicon layer on a substrate W in the chamber 40 by using plasma of the reaction gas, operation S140 for providing a purge gas into the chamber 40, and operation S150 for pumping the chamber 40.

Operation S110 includes an operation for supplying the reaction gas and the inert gas onto the substrate W having an underlayer thereon, and stabilizing the gases while power for generating plasma is not being applied to the chamber 40. The reaction gas may include at least one selected from among monosilane, disilane, and trisilane gases, and the inert gas may include at least one gas selected from among helium (He), neon (Ne), and argon (Ar). Before the amorphous silicon layer is deposited, the substrate W may have an underlayer thereon. That is, the amorphous silicon layer is deposited on the underlayer in contact with the underlayer.

Operation S130 includes an operation for depositing the amorphous silicon layer on the underlayer by using plasma of the reaction gas, which is generated by applying a HF power of 500 W to 700 W and, at the same time, applying a LF power lower than the HF power to the chamber 40.

The LF power may be equal to or higher than 200 W and lower than 600 W. More particularly, the LF power may be equal to or higher than 200 W and equal to or lower than 300 W.

The HF power may have a frequency range of 3 MHz to 30 MHz, and more particularly, a frequency range of 13.56 MHz to 27.12 MHz. The LF power may have a frequency range of 30 KHz to 3,000 KHz, and more particularly, a frequency range of 300 KHz to 600 KHz. For example, the HF power may have a frequency of 13.56 MHz, and the LF power may have a frequency of 370 KHz.

Compared to plasma using the LF power, plasma using the HF power has a lower kinetic energy of radical particles, a higher plasma density, a lower deposition rate, and a smaller sheath region. Meanwhile, compared to plasma using the HF power, plasma using the LF power has a higher kinetic energy of radical particles and thus may easily separate a hydrogen group from the underlayer.

The amorphous silicon layer may be deposited on the underlayer in contact with the underlayer. For example, the underlayer may include one selected from among a spin-on hardmask (SOH) layer, a titanium nitride (TiN) layer, a silicon carbonitride (SiCN) layer, and a silicon oxynitride (SiON) layer. In this case, the amorphous silicon layer may serve as a stopper hard mask, and thus may have a relatively small thickness equal to or less than 500 Å. As another example, the underlayer may include one selected from among a silicon oxide (SiO) layer and a silicon nitride (SiN) layer. In this case, the amorphous silicon layer may serve as a storage node hard mask, and thus may have a relatively large thickness equal to or greater than 800 Å.

Operation S130 for depositing the amorphous silicon layer may be performed based on, for example, a plasma enhanced chemical vapor deposition (PECVD) process. In a chemical vapor deposition (CVD) process, a reaction gas is closely supplied onto a substrate in a chamber, and then reacts with and forms a thin layer on the surface of the object, and a by-product of reaction is removed from the chamber after the deposition process. When heat is applied as energy for reaction of the reaction gas, a temperature of about 500° C. to 1000° C. may be necessary. However, this deposition temperature may have undesirable effects on peripheral elements. As such, the method of forming an amorphous silicon layer, according to an embodiment of the present invention, may use one of popularized CVD processes for reducing reaction temperature, e.g., a PECVD process for ionizing at least a part of a reaction gas, in operation S130. Operation S130 using the PECVD process may be performed at a process temperature of 150° C. to 550° C. More particularly, the operation S130 may be optimized at a process temperature of 390° C. to 410° C.

The dual frequency power application scheme will now be described with reference to FIGS. 2 and 3. The chamber 40 for loading the substrate W therein may include a shower head 42 and a stage heater 44. The substrate W is mounted on the stage heater 44. RF power for generating plasma is applied to the shower head 42 and/or the stage heater 44 serving as electrodes, and plasma P is generated in a space between the shower head 42 and the stage heater 44. To achieve matching, a matching unit(s) 35, or 15 and 25 may be provided between the chamber 40 and first and second generators 10 and 20 for generating the RF power.

Referring to FIG. 2, a LF RF power generated by the first generator 10 and a HF RF power generated by the second generator 20 may be both applied to the shower head 42 serving as electrodes. An electrode to which the LF power is applied and an electrode to which the HF power is applied may be both located above the substrate W in the chamber 40.

Referring to FIG. 3, a LF RF power generated by the first generator 10 may be applied to the shower head 42 serving as an electrode, and a HF RF power generated by the second generator 20 may be applied to the stage heater 44 serving as an electrode. That is, an electrode to which the LF power is applied may be located above the substrate W in the chamber 40, and an electrode to which the HF power is applied may be located under the substrate W in the chamber 40.

Operation S130 for depositing the amorphous silicon layer may be performed immediately after operation S110 for stabilizing the gases, without performing any plasma pre-treatment process on the underlayer. Herein, the plasma pre-treatment process may include a process for pre-treating the underlayer by activating a pre-treatment gas including an ammonia ($NH_3$) gas on the underlayer of the substrate W by using first plasma.

When the underlayer is surface-treated based on the plasma pre-treatment process, since a subsequent amorphous silicon layer may be smoothly deposited, the amorphous silicon layer may achieve excellent roughness and improved thickness uniformity. On the other hand, according to an embodiment of the present invention, since the amorphous silicon layer is deposited using plasma generated by simultaneously applying the HF power and the LF power, the amorphous silicon layer may achieve excellent roughness and improved thickness uniformity without performing any plasma pre-treatment operation between operation S110 for stabilizing the gases and operation S130 for depositing the amorphous silicon layer. As such, a process time may be shortened.

Furthermore, the underlayer is surface-treated based on the plasma pre-treatment process, although interfacial adhesion between the amorphous silicon layer and the underlayer may be improved, a specific underlayer such as a SOH layer may be damaged due to the plasma pre-treatment process, thereby causing a serious problem. On the other hand, according to an embodiment of the present invention, since the amorphous silicon layer is deposited using plasma generated by simultaneously applying the HF power and the LF power, adhesion to various underlayers may be improved without performing any plasma pre-treatment operation between operation S110 for stabilizing the gases and operation S130 for depositing the amorphous silicon layer. As such, damage of a specific underlayer due to plasma pre-treatment may not occur.

Operation S140 for providing the purge gas may be performed immediately after operation S130 for depositing the amorphous silicon layer, without performing any plasma post-treatment process on the amorphous silicon layer. Herein, the plasma post-treatment process may include a process for surface-treating a top surface of the amorphous silicon layer by using plasma including at least one component among a nitrogen group and an oxygen group. When the amorphous silicon layer is surface-treated based on the plasma post-treatment process, a hydrogen group may be effectively removed from and an interfacial protective layer may be formed on an upper interface of the amorphous silicon layer and thus dry etch rate characteristics may be improved in a subsequent dry process. On the other hand, according to an embodiment of the present invention, since the amorphous silicon layer is deposited using plasma generated by simultaneously applying the HF power and the LF power, a hydrogen group may be effectively removed from and an interfacial protective layer may be formed on an upper interface of the amorphous silicon layer without performing any plasma post-treatment operation between operation S130 for depositing the amorphous silicon layer and operation S140 for providing the purge gas. As such, a process time may be shortened.

The technical idea of the present invention will now be described by comparing characteristics of amorphous silicon layers formed using methods according to various test examples of the present invention.

Figure 4A:
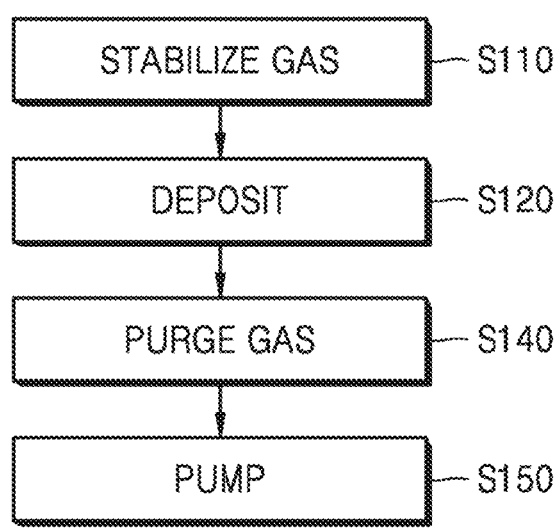
FIGS. 4A and 4B are flowcharts of methods of forming amorphous silicon layers based on PECVD processes, according to comparative example 1 and comparative example 2 of the present invention.
Figure 4B:
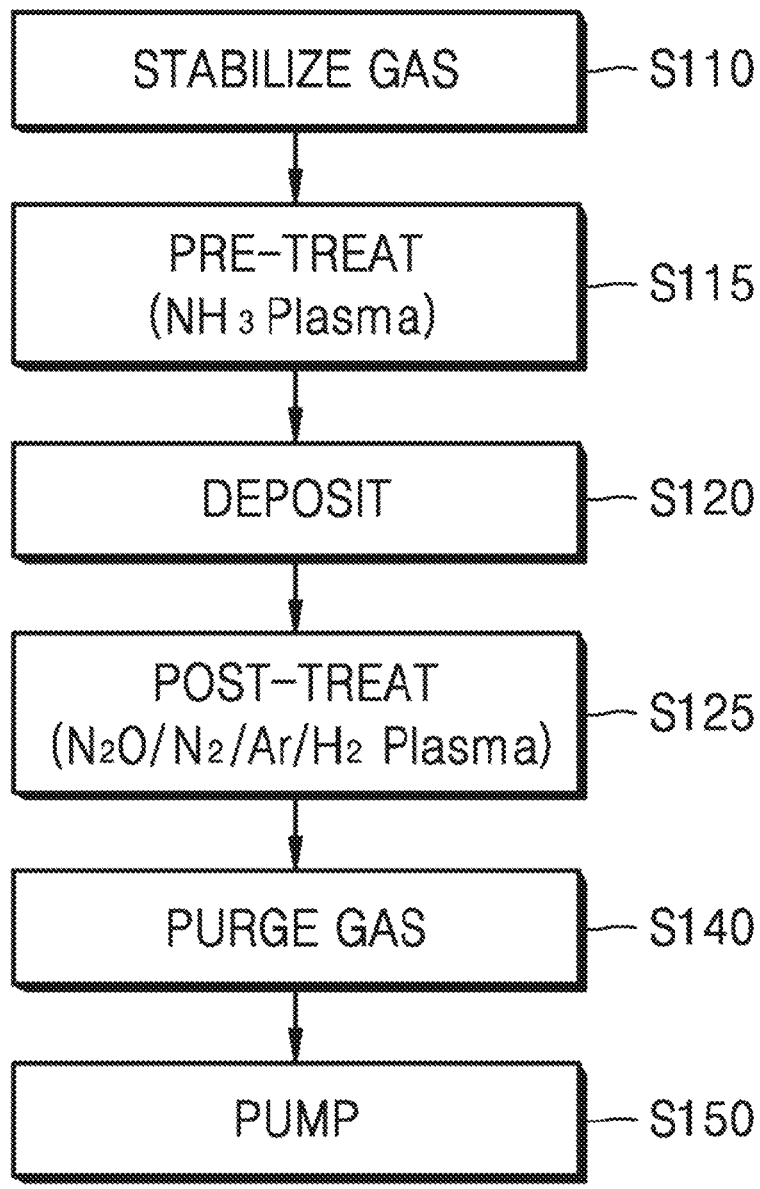

FIGS. 4A and 4B are flowcharts of methods of forming amorphous silicon layers based on PECVD processes, according to comparative example 1 and comparative example 2 of the present invention.

Referring to FIG. 4A or 4B, the method includes operation S110 for supplying a reaction gas and an inert gas onto a substrate having an underlayer thereon, and stabilizing the gases, operation S120 for depositing an amorphous silicon layer on the underlayer by using plasma of the reaction gas, which is generated by applying only a HF power of 13.56 MHz to a chamber, operation S140 for providing a purge gas into the chamber, and operation S150 for pumping the chamber. Furthermore, referring to FIG. 4B, the method may further include operation S115 for pre-treating the underlayer by activating a pre-treatment gas including an ammonia ($NH_3$) gas on the underlayer of the substrate by using first plasma, and operation S125 for surface-treating a top surface of the amorphous silicon layer by using plasma including at least one component among a nitrogen group and an oxygen group.

The amorphous silicon layer formed using the method illustrated in FIG. 4A according to the comparative example 1 of the present invention may be used as a stopper hard mask having a relatively small thickness or a storage node hard mask having a relatively large thickness. However, roughness and uniformity of the amorphous silicon layer differ depending on the type of the underlayer. In addition, a problem such as lifting or air bubbles may occur due to weak interfacial adhesion to the underlayer.

The amorphous silicon layer formed using the method illustrated in FIG. 4B according to the comparative example 2 of the present invention may be used as a stopper hard mask having a relatively small thickness. However, although interfacial adhesion to the underlayer may be improved based on surface treatment, a specific underlayer such as a SOH layer may be damaged due to plasma. In addition, although the amorphous silicon layer formed using the method according to the comparative example 2 of the present invention may be used as a storage node hard mask having a relatively large thickness, when the amorphous silicon layer having a thickness equal to or greater than 800 Å is deposited, unstable formation of the layer in a column shape may occur.

On the other hand, the amorphous silicon layer formed using the above-described method according to an embodiment of the present invention may be used as a stopper hard mask having a relatively small thickness, and thus damage of the underlayer may be prevented and roughness and adhesion to various underlayers may be improved by omitting a plasma pre-treatment process. In addition, since the amorphous silicon layer formed using the above-described method according to an embodiment of the present invention may be used as a storage node hard mask having a relatively large thickness, even when an amorphous silicon layer having a large thickness is deposited, the layer may grow uniformly and unstable formation of the layer in a column shape may be prevented.

FIG. 5 is a table of images showing adhesion states of amorphous silicon layers to various underlayers, and damages of the underlayers, according to test examples of the present invention. The images of the first row are images of various types of underlayers and amorphous silicon layers formed on the underlayers by using the method of FIG. 4A (comparative example 1), the images of the second row are images of various types of underlayers and amorphous silicon layers formed on the underlayers by using the method of FIG. 4B (comparative example 2), and the images of the third row are images of various types of underlayers and amorphous silicon layers formed on the underlayers by using the method of FIG. 1 (an embodiment).

Referring to FIG. 5, according to the comparative examples of the present invention, it is shown that the adhesion state between the underlayer and the amorphous silicon layer is bad or the underlayer is damaged due to plasma pre-treatment, depending on the type of the underlayer. Specifically, according to the comparative example 1, it is shown that, when the underlayer is a SiN layer or a TiN layer, the adhesion state between the underlayer and the amorphous silicon layer is bad. According to the comparative example 2, it is shown that, when the underlayer is a SOH layer, the SOH layer is damaged due to plasma pre-treatment. On the other hand, according to the embodiment of the present invention, it is shown that every type of the underlayer is not damaged and the adhesion state between the underlayer and the amorphous silicon layer is good.

FIG. 6 is a table of images for checking issues relating to formation of layers of amorphous silicon layers having relatively large thicknesses and formed to be used as storage node hard masks, according to test examples of the present invention. The images of the first column are images of amorphous silicon layers formed on underlayers by using the method of FIG. 4A (a comparative example), and the images of the second column are images of amorphous silicon layers formed on underlayers by using the method of FIG. 1 (an embodiment).

Referring to FIG. 6, according to the comparative example of the present invention, it is shown that a column shape is observed in the amorphous silicon layer having a relatively large thickness equal to or greater than 800 Å. On the other hand, according to the embodiment of the present invention, it is shown that a column shape is not observed in the amorphous silicon layer having a relatively large thickness equal to or greater than 800 Å.

Figure 7:
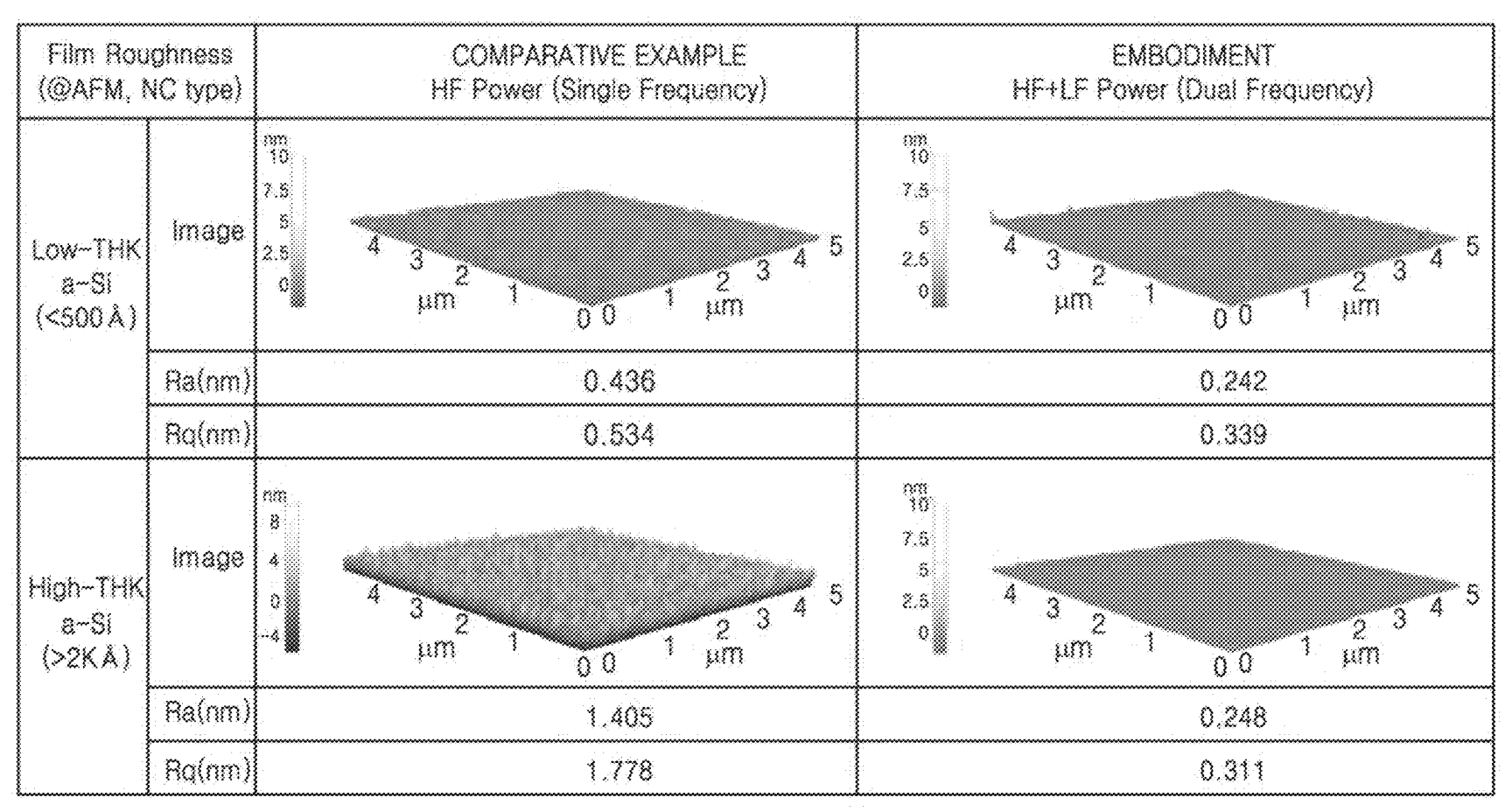

FIG. 7 is a table comparatively showing roughness of amorphous silicon layers formed according to test examples of the present invention. Images and values of the first column show roughness of amorphous silicon layers formed on underlayers by using the method of FIG. 4A (a comparative example), and images and values of the second column show roughness of amorphous silicon layers formed on underlayers by using the method of FIG. 1 (an embodiment). Meanwhile, the images and values of the first row relate to an amorphous silicon layer having a relatively small thickness less than 500 Å, and the images and values of the second row relate to an amorphous silicon layer having a relatively large thickness greater than 2000 Å.

Referring to FIG. 7, it is shown that the roughness of the amorphous silicon layer having a relatively small thickness is improved from 0.534 (the comparative example) to 0.339 (the embodiment). It is also shown that the roughness of the amorphous silicon layer having a relatively large thickness is improved from 1.778 (the comparative example) to 0.311 (the embodiment).

Figure 8:
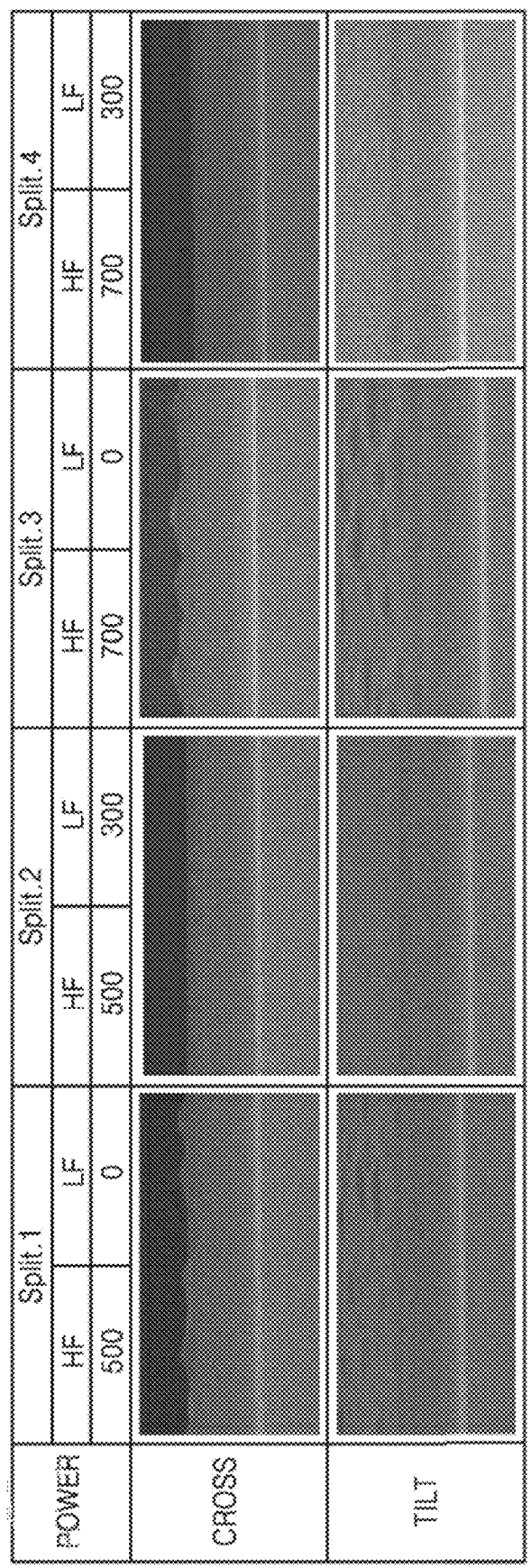

FIGS. 8 and 9 are tables comparatively showing morphology of amorphous silicon layers formed on nitride layers, according to test examples of the present invention.

In FIG. 8, images of the first column relate to an amorphous silicon layer formed using plasma generated by applying only a HF power of 500 W, images of the second column relate to an amorphous silicon layer formed using plasma generated by applying a HF power of 500 W and, at the same time, applying a LF power of 300 W, images of the third column relate to an amorphous silicon layer formed using plasma generated by applying only a HF power of 700 W, and images of the fourth column relate to an amorphous silicon layer formed using plasma generated by applying a HF power of 700 W and, at the same time, applying a LF power of 300 W. Meanwhile, the images of the first row are vertical cross-sectional images, and the images of the second row are tilted images.

Referring to FIG. 8, it is shown that poor surface morphology is obtained when the amorphous silicon layer is formed using plasma generated by applying only the HF power, and the surface morphology is improved when the amorphous silicon layer is formed using plasma generated by applying the HF power and, at the same time, applying the LF power.

In FIG. 9, the first image is a scanning electron microscope (SEM) image of an amorphous silicon layer formed using plasma generated by applying only a HF power of 500 W, and the second to fifth images are SEM images of amorphous silicon layers formed using plasma generated by applying a HF power of 500 W and, at the same time, applying LF powers of 50 W, 100 W, 200 W, and 300 W, respectively.

Referring to FIG. 9, it is shown that poor surface morphology of the amorphous silicon layer is obtained when the amorphous silicon layer is formed using plasma generated by applying only the HF power of 500 W, and the surface morphology is improved when the amorphous silicon layer is formed using plasma generated by applying the HF power and, at the same time, applying the LF power. It is also shown that the surface morphology is further improved in a case when the LF power is 200 W or 300 W compared to a case when the LF power is 50 W or 100 W.

According to the afore-described embodiments of the present invention, a method of forming an amorphous silicon layer, the method being capable of improving adhesion to an underlayer, layer quality, and roughness, may be provided. However, the scope of the present invention is not limited to the above effect.

While the present invention has been particularly shown and described with reference to embodiments thereof, it will be understood by one of ordinary skill in the art that various changes in form and details may be made therein without departing from the spirit and scope of the present invention as defined by the following claims.

What is claimed is:

1. A method of forming an amorphous silicon layer, the method comprising the steps of:
    supplying a reaction gas and an inert gas onto a substrate on which an underlayer is disposed and stabilizing the gases while power for generating plasma is not being applied to a chamber;
    depositing an amorphous silicon layer on the underlayer by using plasma of the reaction gas, which is generated by applying a high-frequency (HF) power of 500 W to 700 W and, at the same time, applying a low-frequency (LF) power lower than the HF power to the chamber;
    providing a purge gas into the chamber; and
    pumping the chamber.

2. The method of claim 1, wherein the LF power is equal to or greater than 200 W and lower than 600 W.

3. The method of claim 1, wherein the LF power is equal to or greater than 200 W and equal to or smaller than 300 W.

4. The method of claim 1, wherein the reaction gas comprises at least one selected from among monosilane, disilane, and trisilane gases, and wherein the inert gas comprises at least one gas selected from among helium (He), neon (Ne), and argon (Ar).

5. The method of claim 1, wherein the amorphous silicon layer has a thickness equal to or smaller than 500 Å, and
wherein the underlayer comprises one selected from among a spin-on hardmask (SOH) layer, a titanium nitride (TiN) layer, a silicon carbonitride (SiCN) layer, and a silicon oxynitride (SiON) layer.

6. The method of claim 1, wherein the amorphous silicon layer has a thickness equal to or greater than 800 Å, and
wherein the underlayer comprises one selected from among a silicon oxide (SiO) layer and a silicon nitride (SiN) layer.

7. The method of claim 1, wherein the HF power has a frequency of 13.56 MHz to 27.12 MHz, and
wherein the LF power has a frequency of 300 KHz to 600 KHz.

8. The method of claim 7, wherein the HF power has a frequency of 13.56 MHz, and
wherein the LF power has a frequency of 370 KHz.

9. The method of claim 1, wherein the depositing an amorphous silicon layer is performed at a process temperature of 150° C. to 550° C.

* * * * *